US009947562B2

(12) United States Patent
Chen et al.

(10) Patent No.: US 9,947,562 B2
(45) Date of Patent: Apr. 17, 2018

(54) METHOD AND APPARATUS FOR PROCESSING SEMICONDUCTOR WORK PIECES

(75) Inventors: AiHua Chen, Shanghai (CN); Ryoji Todaka, Shanghai (CN); Gerald Yin, Shanghai (CN)

(73) Assignees: APPLIED MATERIALS, INC., Santa Clara, CA (US); ADVANCED MICRO-FABRICATION EQUIPMENT, INC. ASIA, George Town, Grand Cayman (KY)

(*) Notice: Subject to any disclaimer, the term of this patent is extended or adjusted under 35 U.S.C. 154(b) by 1175 days.

(21) Appl. No.: 13/016,742

(22) Filed: Jan. 28, 2011

(65) Prior Publication Data
US 2011/0305544 A1    Dec. 15, 2011

Related U.S. Application Data

(62) Division of application No. 11/441,291, filed on May 24, 2006, now abandoned.

(30) Foreign Application Priority Data

Aug. 5, 2005 (CN) .......................... 2005 1 0028563

(51) Int. Cl.
*H01L 21/67* (2006.01)
*C23C 16/458* (2006.01)

(52) U.S. Cl.
CPC ........ *H01L 21/6719* (2013.01); *C23C 16/458* (2013.01); *C23C 16/4582* (2013.01); *C23C 16/4583* (2013.01); *C23C 16/4584* (2013.01)

(58) Field of Classification Search
CPC ............... H01L 21/6719; C23C 16/458; C23C 16/4582; C23C 16/4583; C23C 16/4584
USPC ............ 118/715, 729, 730, 733; 156/345.37, 156/345.54, 345.55
See application file for complete search history.

(56) References Cited

U.S. PATENT DOCUMENTS

| | | | |
|---|---|---|---|
| 3,128,205 A | 4/1964 | Illsley | |
| 4,438,154 A | 3/1984 | Kato et al. | |
| 4,485,759 A | 12/1984 | Brandolf | |
| 4,548,698 A | 10/1985 | Sellschopp | |
| 4,579,618 A | 4/1986 | Celestino et al. | |
| 4,790,921 A | 12/1988 | Bloomquist et al. | |
| 4,821,674 A | 4/1989 | deBoer et al. | |
| 5,020,475 A | 6/1991 | Crabb et al. | |
| 5,029,555 A | 7/1991 | Dietrich et al. | |
| 5,165,165 A * | 11/1992 | Aoki ................... | H05K 13/0404 140/105 |
| 5,370,739 A | 12/1994 | Foster et al. | |
| 5,421,892 A | 6/1995 | Miyagi | |
| 5,434,110 A | 7/1995 | Foster et al. | |
| 5,580,524 A | 12/1996 | Forrest et al. | |
| 5,667,592 A * | 9/1997 | Boitnott ................ | C23C 14/568 118/719 |
| 5,683,606 A | 11/1997 | Ushikoshi et al. | |
| 5,830,277 A * | 11/1998 | Johnsgard et al. ........... | 118/725 |

(Continued)

Primary Examiner — Jeffrie R Lund
(74) Attorney, Agent, or Firm — Goodwin Procter LLP

(57) ABSTRACT

A processing apparatus for semiconductor work pieces and related methodology is disclosed and which includes a processing chamber having an internal cavity, and which has a plurality of rotatable processing stations positioned therein and wherein the rotatable processing stations each process a semiconductor work piece.

9 Claims, 15 Drawing Sheets

(56) References Cited

U.S. PATENT DOCUMENTS

| | | | |
|---|---|---|---|
| 5,855,681 A | 1/1999 | Maydan et al. | |
| 5,911,834 A * | 6/1999 | Fairbairn | B01J 4/00 118/715 |
| 6,143,082 A * | 11/2000 | McInerney et al. | 118/719 |
| 6,152,070 A * | 11/2000 | Fairbairn | H01L 21/67201 118/719 |
| 6,190,460 B1 | 2/2001 | Hwang | |
| 6,197,121 B1 | 3/2001 | Gurary et al. | |
| 6,235,121 B1 | 5/2001 | Honma et al. | |
| 6,331,212 B1 | 12/2001 | Mezey, Sr. | |
| 6,352,593 B1 * | 3/2002 | Brors et al. | 118/724 |
| 6,413,321 B1 * | 7/2002 | Kim | C23C 16/0209 118/719 |
| 6,576,062 B2 | 6/2003 | Matsuse | |
| 6,580,082 B1 | 6/2003 | Mitchell | |
| 6,620,254 B2 | 9/2003 | Zaech et al. | |
| 6,689,221 B2 | 2/2004 | Ryding et al. | |
| 6,807,972 B2 | 10/2004 | Chiu et al. | |
| 6,957,956 B2 | 10/2005 | Toba et al. | |
| 7,201,808 B2 | 4/2007 | Chiu et al. | |
| 7,516,833 B2 * | 4/2009 | Todaka | 198/345.1 |
| 8,137,465 B1 * | 3/2012 | Shrinivasan et al. | 118/719 |
| 8,454,750 B1 * | 6/2013 | Shrinivasan et al. | 118/719 |
| 8,715,418 B2 * | 5/2014 | Chen | 118/730 |
| 2001/0009177 A1 * | 7/2001 | Luo et al. | 156/345 |
| 2003/0124820 A1 * | 7/2003 | Johnsgard et al. | 438/482 |
| 2004/0247787 A1 * | 12/2004 | Mackie et al. | 427/248.1 |
| 2005/0011459 A1 | 1/2005 | Liu | |
| 2005/0022737 A1 * | 2/2005 | Shimizu et al. | 118/715 |
| 2005/0263066 A1 * | 12/2005 | Lubomirsky et al. | 118/500 |
| 2006/0005856 A1 * | 1/2006 | Sun | B08B 7/0035 134/1.1 |
| 2006/0281310 A1 | 12/2006 | Smith et al. | |
| 2007/0032097 A1 | 2/2007 | Chen et al. | |
| 2007/0034479 A1 * | 2/2007 | Todaka | H01L 21/6719 198/463.1 |
| 2007/0209932 A1 | 9/2007 | Sferlazzo et al. | |
| 2011/0305544 A1 * | 12/2011 | Chen et al. | 414/222.01 |

* cited by examiner

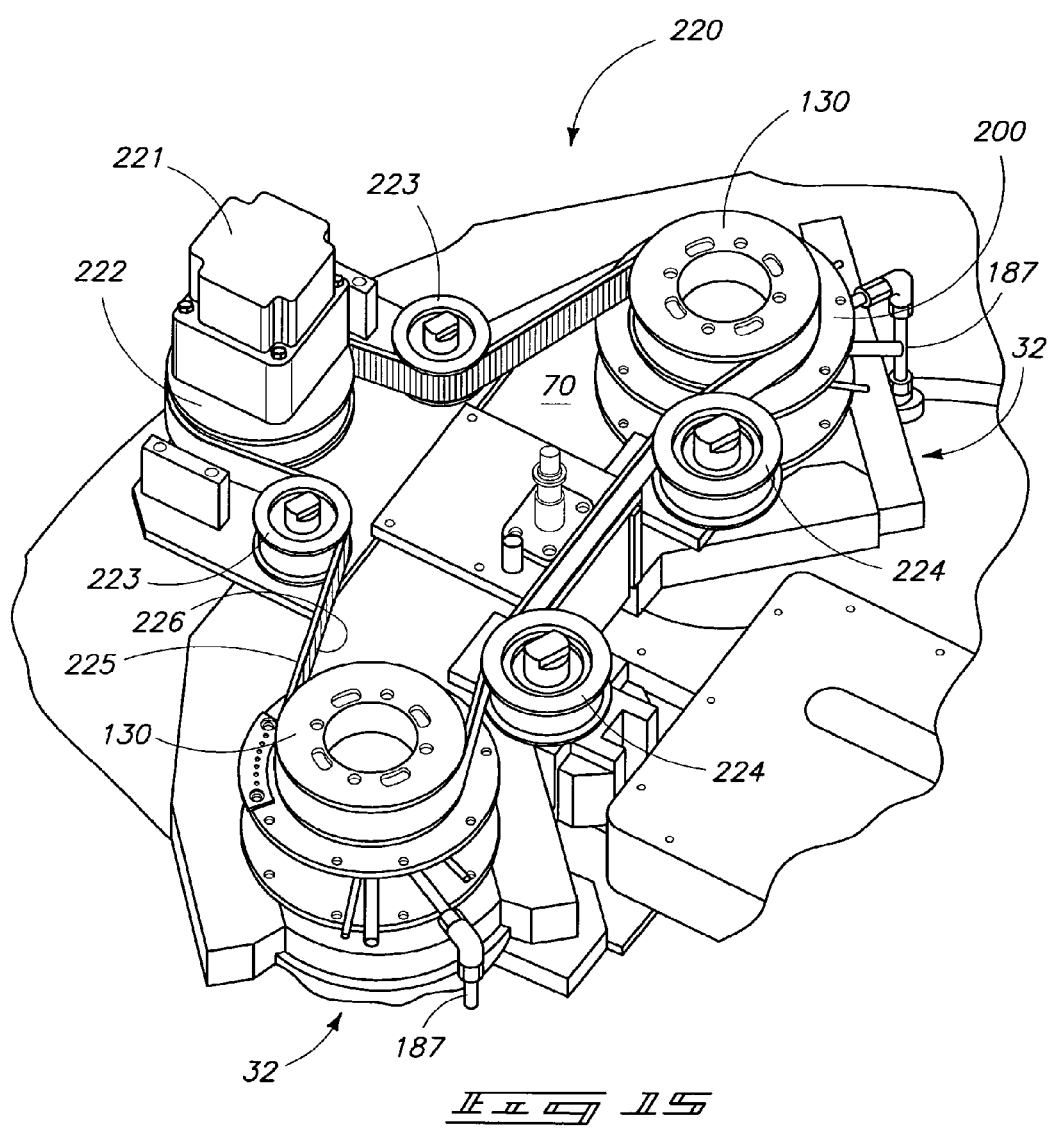

US 9,947,562 B2

METHOD AND APPARATUS FOR PROCESSING SEMICONDUCTOR WORK PIECES

RELATED PATENT DATA

This application is a divisional application of U.S. patent application Ser. No. 11/441,291, filed May 24, 2006, the text of which is incorporated herein by reference, which claims priority from Chinese Patent Application Serial No. 200510028563.2, which was filed on Aug 5, 2005.

TECHNICAL FIELD

The present apparatus relates to a method and apparatus for processing semiconductor work pieces, and more specifically to an apparatus which includes multiple processing chambers for processing a plurality of semiconductor work pieces, and multiple processing stations within each of the multiple processing chambers.

BACKGROUND OF THE INVENTION

Presently, two types of semiconductor processing systems are employed for fabricating semiconductor work pieces. The first type of system is a batch processing system; while the second type of system which is commonly used processes single semiconductor work pieces. In batch processing systems, semiconductor work pieces are typically oriented in either a horizontal or vertical orientation, and are thereafter processed at the same time.

Although single piece semiconductor processing systems have many advantages including producing uniform semiconductor products, they also have numerous shortcomings including low throughput; high overhead operating costs; and problems achieving uniform heating of the semiconductor work pieces that are being processed. These long recognized problems associated with single piece processing devices have yet to be overcome.

Attempts have been made to address the problems associated with the prior art batch processing systems. For example, in U.S. Pat. No. 5,855,681, a batch processing system is described, and which includes multiple processing chambers. Each of the processing chambers includes multiple processing stations. In this prior art device, the processing chambers can process multiple semiconductor work pieces at one time.

While these and other devices have worked with some degree of success, there are shortcomings that have detracted from their usefulness. For example, one of the biggest problems associated with batch processing systems lies principally with insuring uniformity during the processing of the respective semiconductor work pieces. In this regard, when batch processing a plurality of semiconductor work pieces, the multiple semiconductor work pieces are placed in the same chamber. Consequently, differences in heat and gas flow in the processing chamber may cause non-uniform processing of the several semiconductor work pieces. To overcome the problems associated with non-uniform processing, several solutions have been proposed. For example, and referring now to FIG. 1, a processing apparatus for semiconductor work pieces 10 is illustrated and wherein a silicon substrate to be processed 11 is placed on a carbon pedestal 12. Positioned below and in spaced relation relative to the carbon pedestal there is a second, heating pedestal 13. Located within the heating pedestal there is a high frequency heating coil 14 which is operable to impart heat energy to the silicon substrate 11. During processing, the carbon pedestal 12 can rotate around a central shaft together with the carbon pedestal support 15. This arrangement has been utilized to try to insure uniform temperature processing.

Referring now to FIG. 2, another prior art semiconductor work piece processing apparatus 20 is disclosed and which is more particularly discussed in published U.S. Patent Application 2005/0011459. The semiconductor processing apparatus 20 includes a rotatable semiconductor work piece carrier 21 which is positioned within a processing chamber 22. A semiconductor work piece 23 is placed on the semiconductor work piece carrier 21. The semiconductor work piece carrier 21 rotates around a shaft 24. Further, a heating pedestal 25 is provided which is stationary, and located in a position which is closely adjacent thereto. A small passageway 26 is defined between the semiconductor work piece carrier 21, and the adjacent reaction chamber 22. In the present prior art device, the semiconductor work piece carrier is rotated while gas is simultaneously delivered to the reaction chamber and flows horizontally, outwardly along the passageway 26. This arrangement attempts to provide uniform film growth on the semiconductor work piece 23 during processing.

While many of the difficulties associated with prior art batch processing devices utilized heretofore can be remedied by means of the prior art devices shown in FIGS. 1 and 2, these same assemblies also create other problems. In both prior art devices, multiple semiconductor work pieces are placed on the same semiconductor work piece carrier. Further, these same semiconductor work piece carriers are heated by a stationary heating pedestal. Uniform heating of the semiconductor work pieces is affected by the rotation of the semiconductor work piece carrier apparatus relative to the stationary heating pedestal. The difficulty associated with this particular type of approach is that the separation of the heating apparatus from the semiconductor work piece carrier adds a degree of complexity to the overall processing system. Still further, achieving a uniform space or gap between the semiconductor work piece carrier and the underlying heating pedestal becomes difficult thereby making the control of the processing temperature an increasing problem. In addition to the foregoing difficulties, the prior art devices all employ semiconductor work piece carriers which are driven or rotate thereabout a common shaft. This is not an ideal solution for semiconductor processing devices which have multiple processing stations within one processing chamber.

Therefore, a semiconductor processing apparatus which avoids the shortcomings attendant with the prior art practices and methodology utilized heretofore is the subject matter of the present application.

SUMMARY OF THE INVENTION

A first aspect of the present invention relates to a processing apparatus for semiconductor work pieces which includes a processing chamber having an internal cavity and which has a plurality of rotatable processing stations within the internal cavity, and which are each operable to process a semiconductor work piece.

Another aspect of the present invention relates to a processing apparatus for semiconductor work pieces, and which includes a chamber defining an internal cavity; a plurality of rotatable and heated processing stations received in the internal cavity, and which are each operable to process a semiconductor work piece; and wherein at least two of the processing stations rotate in a substantially synchronous fashion so as to facilitate the substantially uniform processing of the semiconductor work pieces; and a motor drivingly coupled to the at least two of the rotatable and heated processing stations, and which facilitates the synchronous rotation of the at least two processing stations.

Another aspect of the present invention relates to a processing apparatus for semiconductor work pieces and which includes a processing chamber having an internal cavity, and which has a plurality of rotatable processing stations within the internal cavity, and which are each operable to process a semiconductor work piece; a platform rotation mechanism individually cooperating with each of the rotatable processing stations, and positioned below each of the processing stations, and wherein the platform rotation mechanism rotates and heats the respective processing stations, and wherein the respective processing stations each define a passageway which extends therethrough, and which will accommodate electrical signal inputs; and a sealing member is borne by the processing chamber, and which facilitates the formation of an airtight environment within the internal cavity of the processing chamber.

Still another aspect of the present invention relates to a processing apparatus for semiconductor work pieces and which includes a processing chamber having an internal cavity and which has a plurality of rotatable processing stations within the internal cavity, and which are each operable to process a semiconductor work piece, and wherein each of the plurality of rotatable processing stations can move upwardly, downwardly and/or rotate relative to the processing chamber; sealing assemblies mounted on the processing chamber and which maintain the internal cavity of the processing chamber substantially sealed while the rotatable processing stations move upwardly, downwardly and rotate; and a cooling apparatus for cooling the sealing assemblies to facilitate the proper operation of the sealing assemblies.

Still another aspect of the present invention relates to a method for processing semiconductor work pieces which includes the steps of providing a processing chamber having an internal cavity; providing a plurality of processing stations within the internal cavity of the processing chamber; positioning individual semiconductor work pieces on each of the individual processing stations; and rotating and heating the individual processing stations so as to facilitate the effective processing of the semiconductor work pieces within the internal cavity of the processing chamber.

These and other aspects of the present invention will become readily apparent hereinafter.

BRIEF DESCRIPTION OF THE DRAWINGS

Preferred embodiments of the invention are described below with reference to the following accompanying drawings.

FIG. 15 illustrates an arrangement which rotates the adjoining processing stations of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 14:
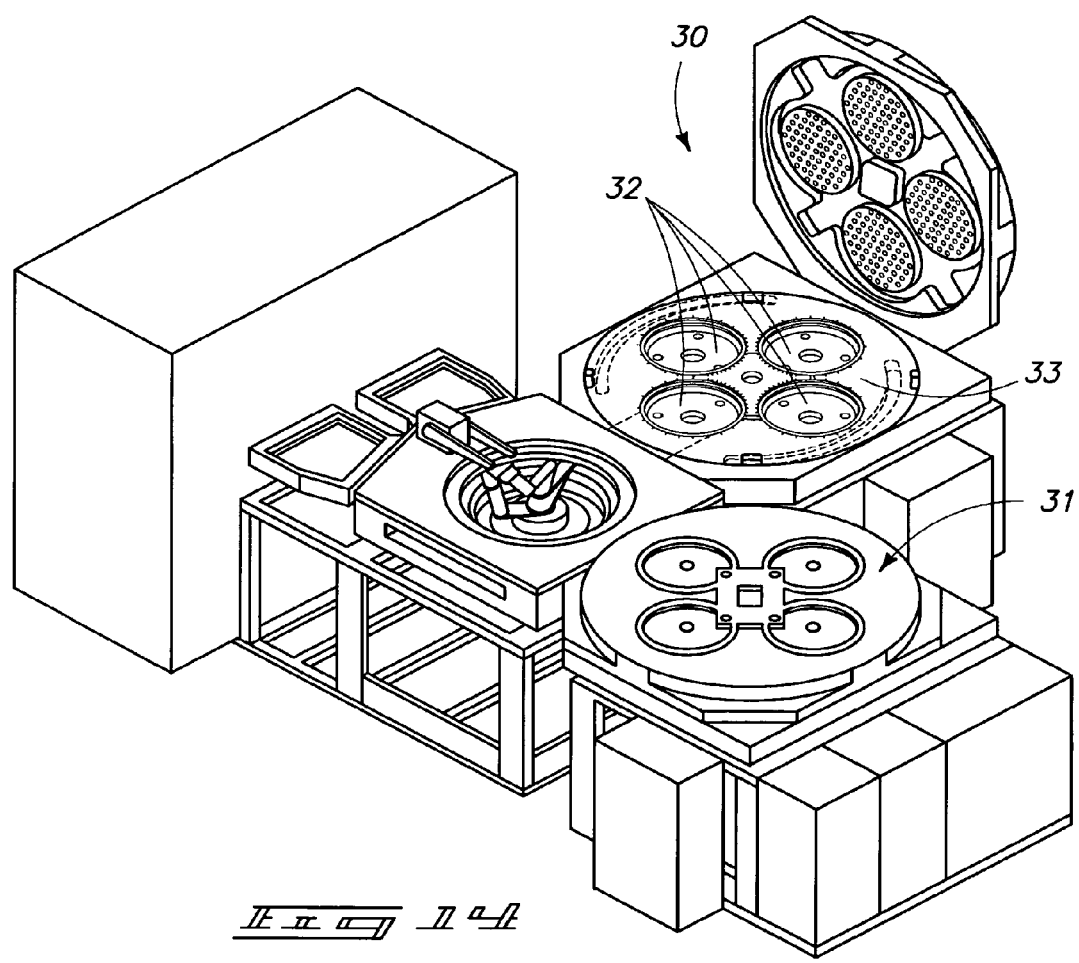
FIG. 14 illustrates one possible form of a semiconductor processing system which may employ the apparatus of the present invention.

Referring more specifically to FIG. 14, a semiconductor processing system which incorporates the teachings of the present invention is shown therein. The semiconductor processing system 30 has a processing chamber 31 having an internal cavity 33 and which is operable to receive a plurality of rotatable processing stations which are generally indicated by the numeral 32. As will be described in greater detail hereinafter, the plurality of rotatable processing stations 32 process individual semiconductor work pieces in a manner not possible, heretofore. Therefore, one aspect of the present invention relates to a semiconductor processing system 30 which mounts a plurality of rotatable processing stations 32, and which are each operable to process semiconductor work pieces while simultaneously heating same.

Figure 1:
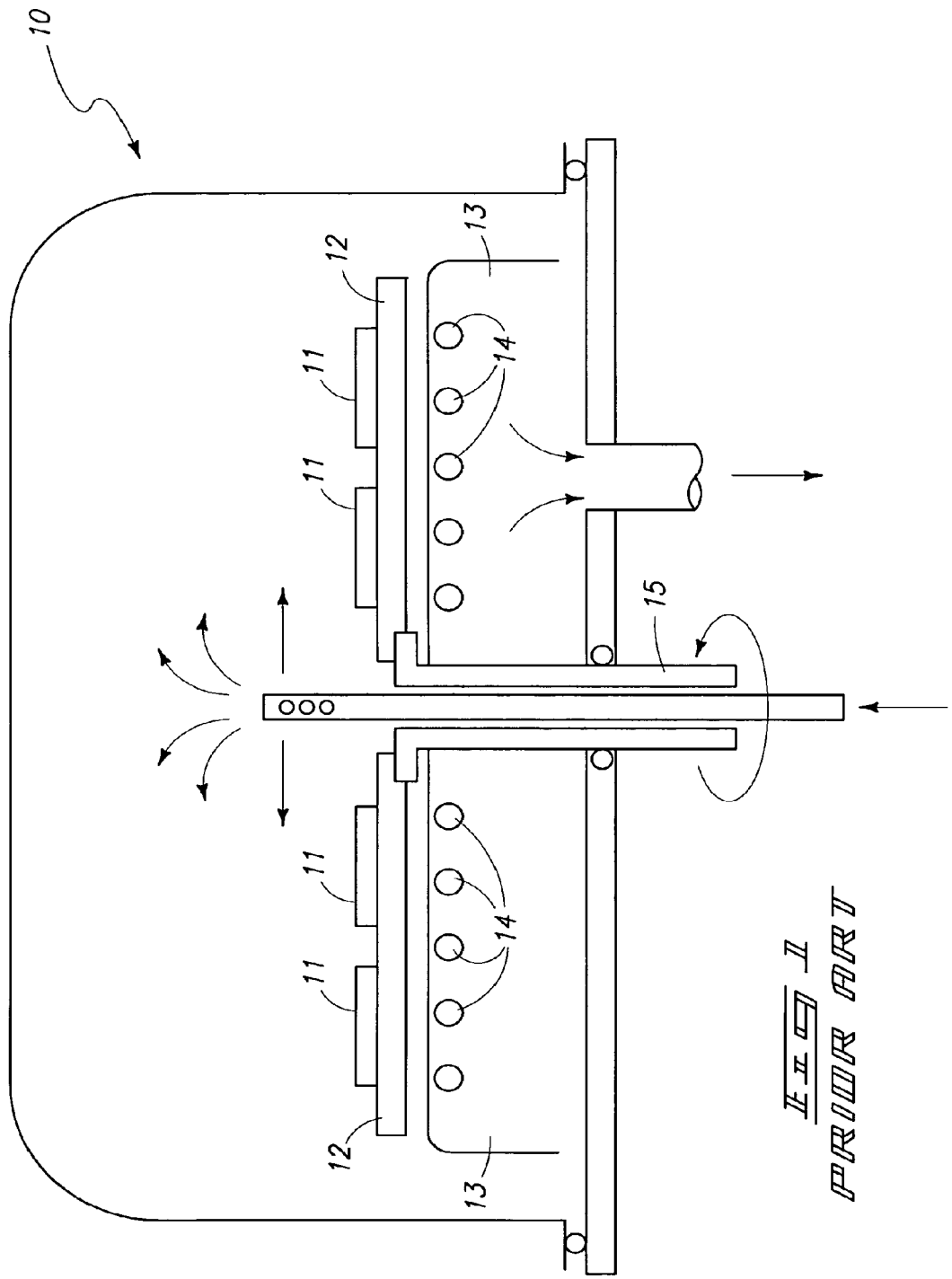
FIG. 1 is a greatly simplified schematic diagram of an existing prior art processing apparatus for semiconductor work pieces.
Figure 2:
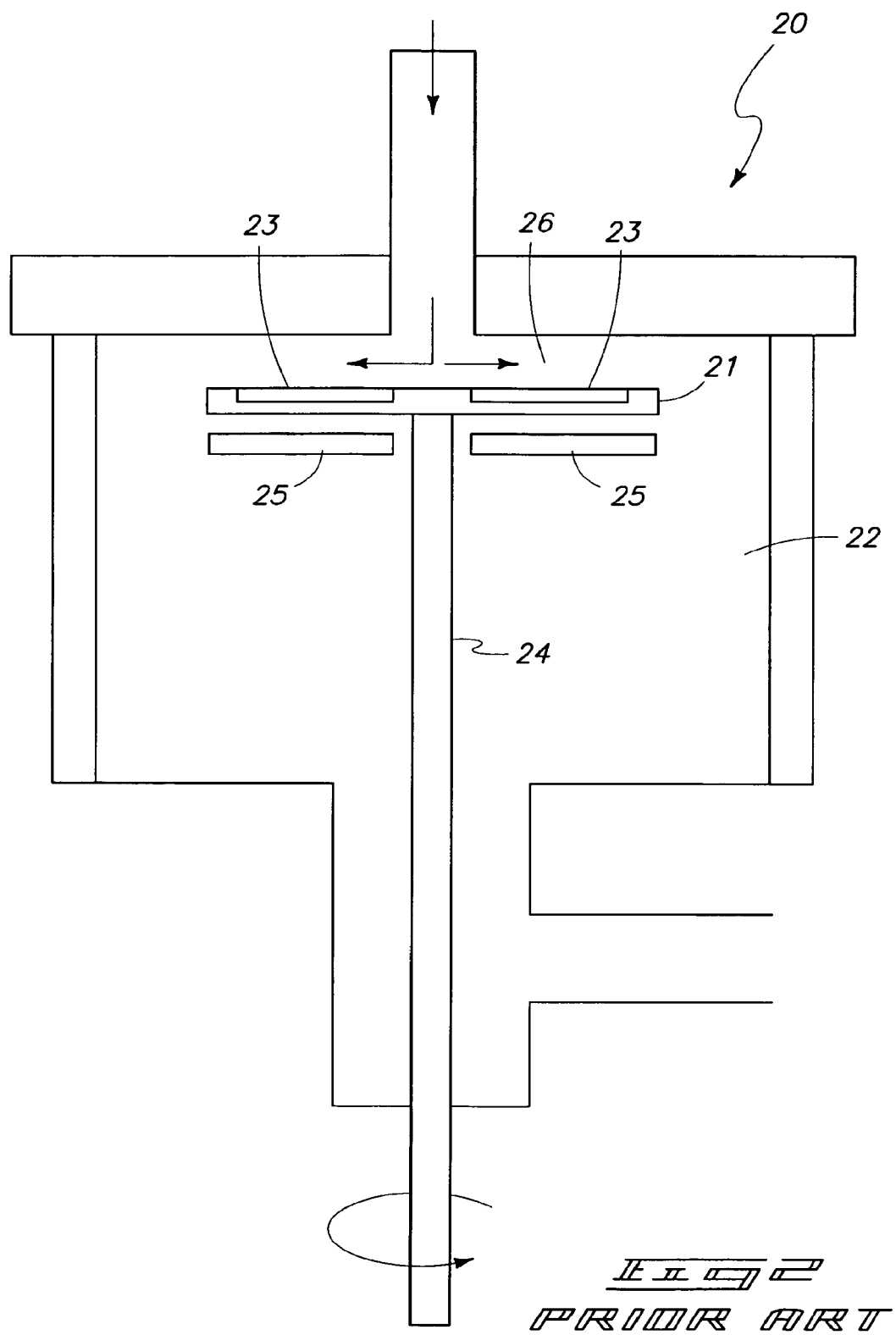
FIG. 2 is a second, greatly simplified schematic diagram of a second processing apparatus for semiconductor work pieces.
Figure 3:
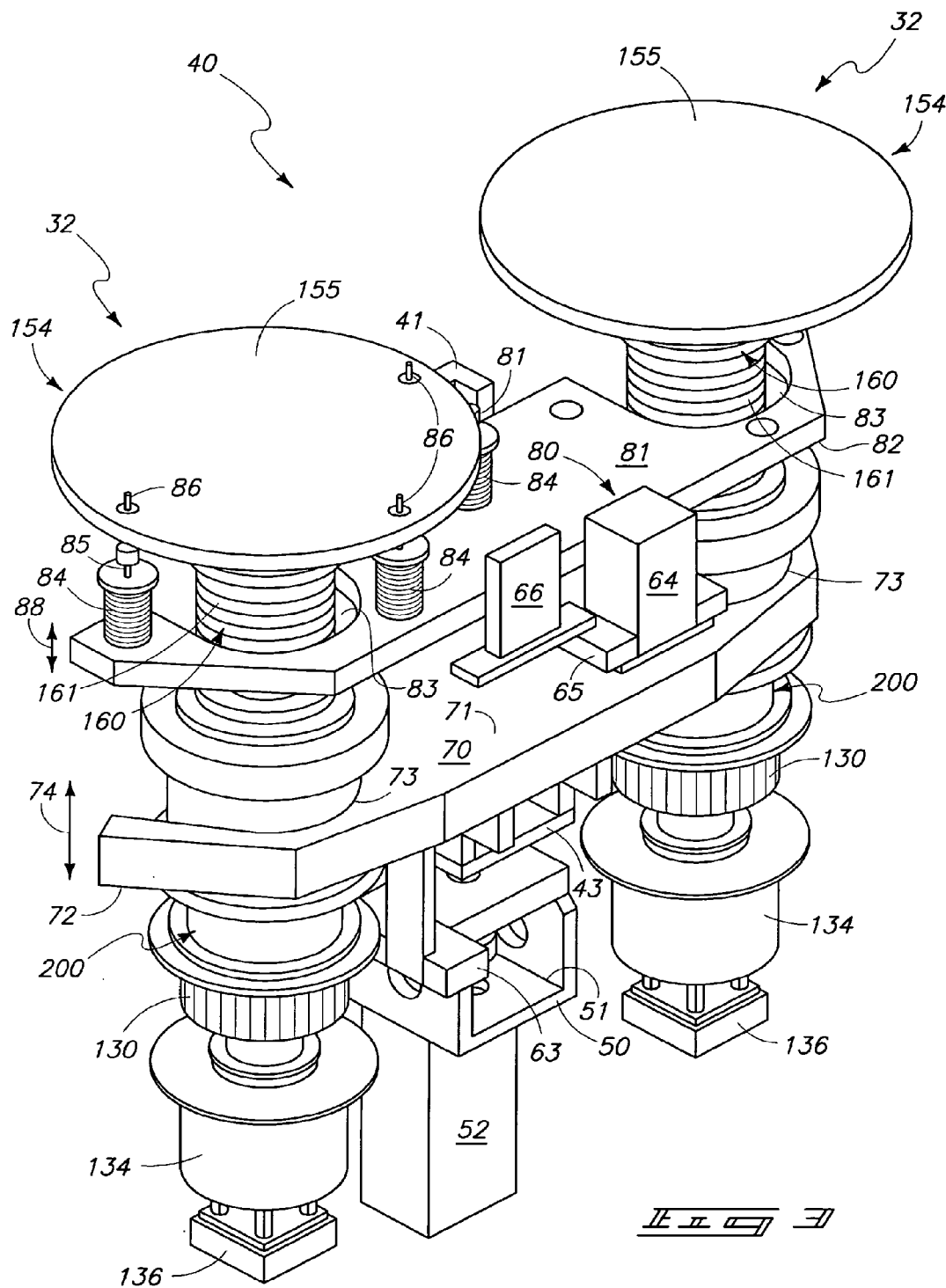
FIG. 3 is a perspective, fragmentary view of the processing apparatus for semiconductor work pieces of the present invention.

Referring more specifically to now FIG. 3, one embodiment of the processing apparatus 40 for semiconductor work pieces of the present invention is shown. For purposes of clarity, only two processing stations 32 are illustrated. However, it will be recognized that the present invention is not limited to two processing stations but may have various numbers of processing stations depending upon the arrangement of the processing chamber 31.

Figure 4:
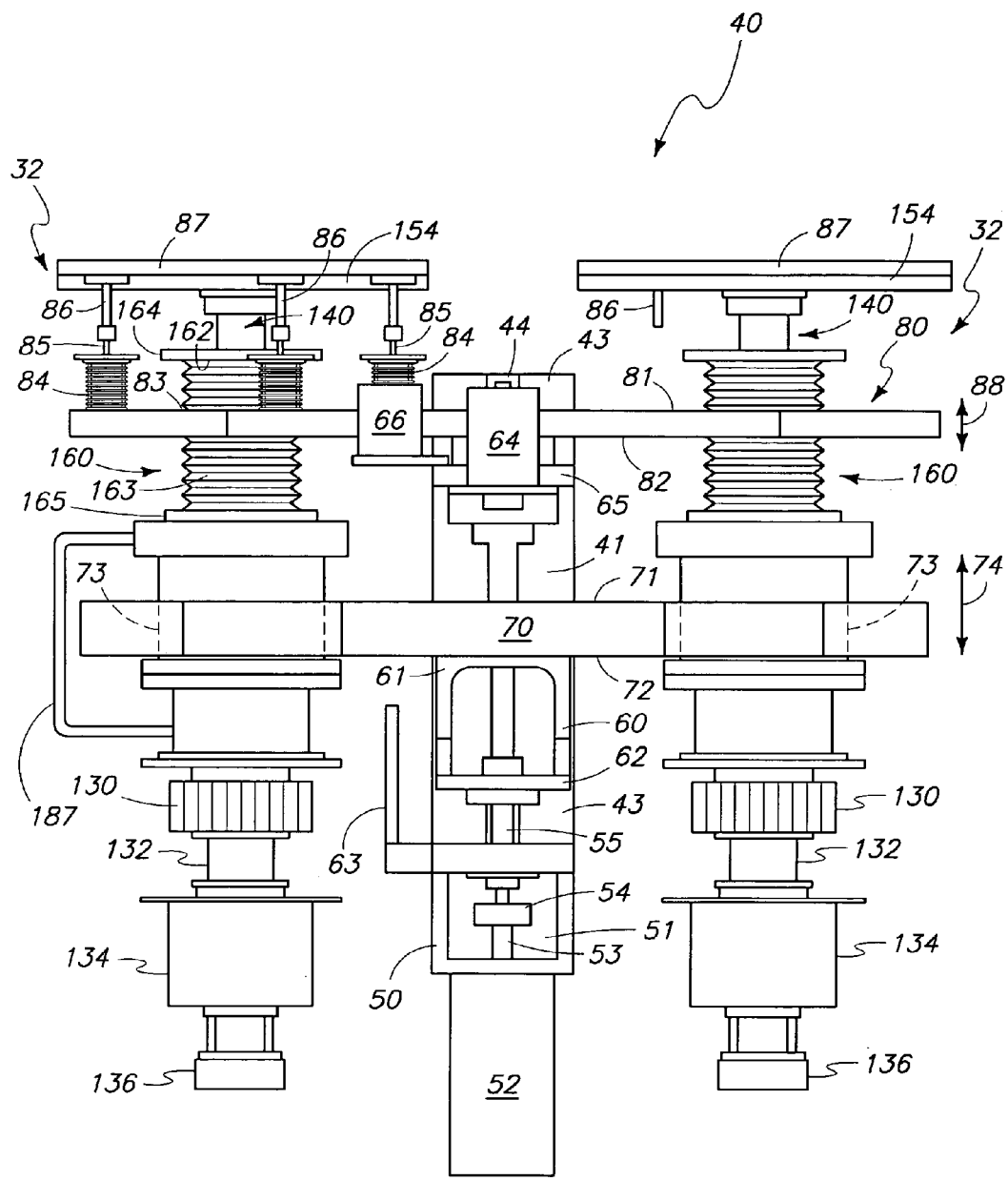
FIG. 4 is a fragmentary, side elevation view of the processing apparatus for semiconductor work pieces of the present invention.
Figure 5:
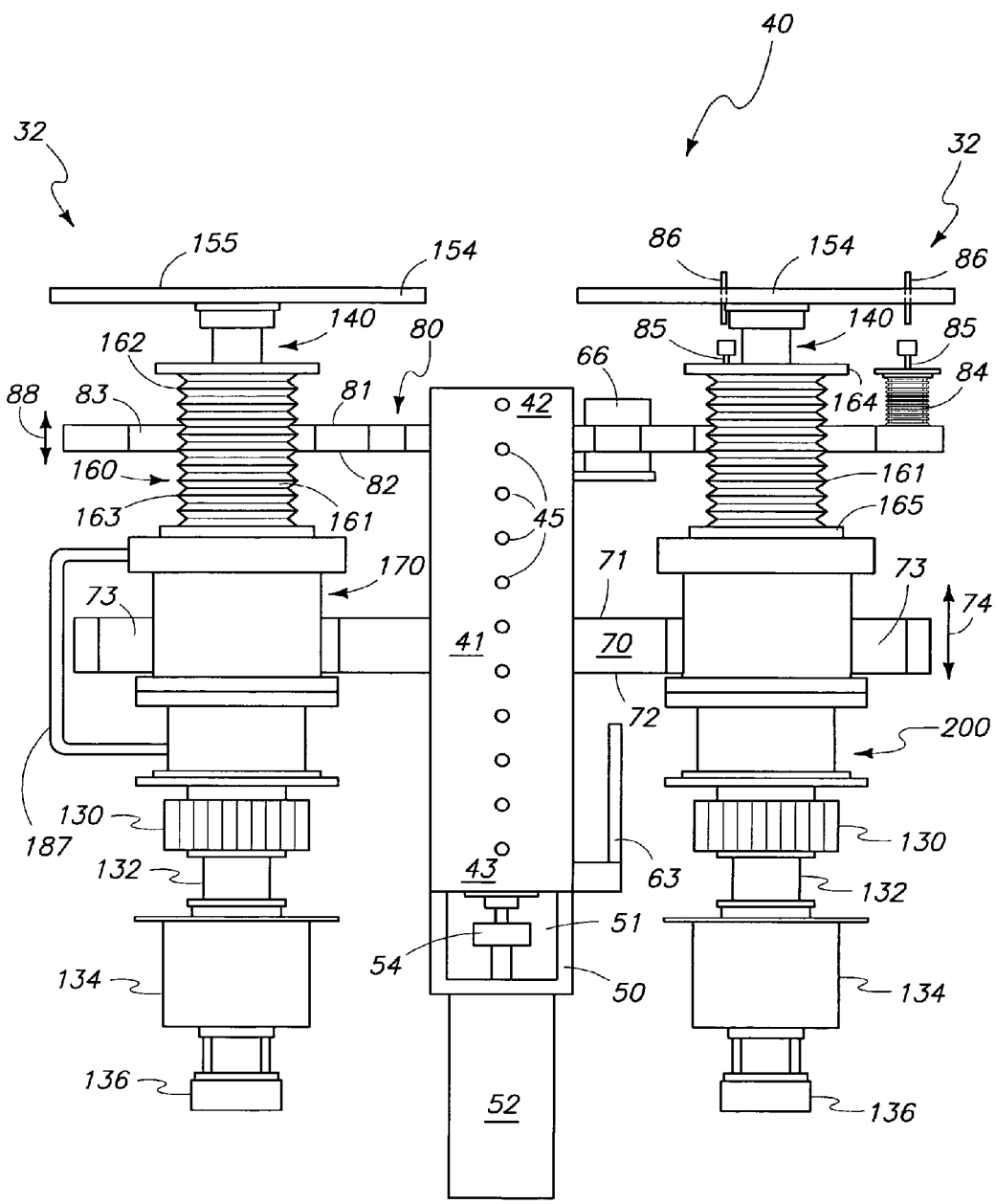
FIG. 5 is a second, fragmentary, side elevation view of the processing apparatus for semiconductor work pieces of the present invention, and which is taken from a position opposite to that seen in FIG. 4.
Figure 6:
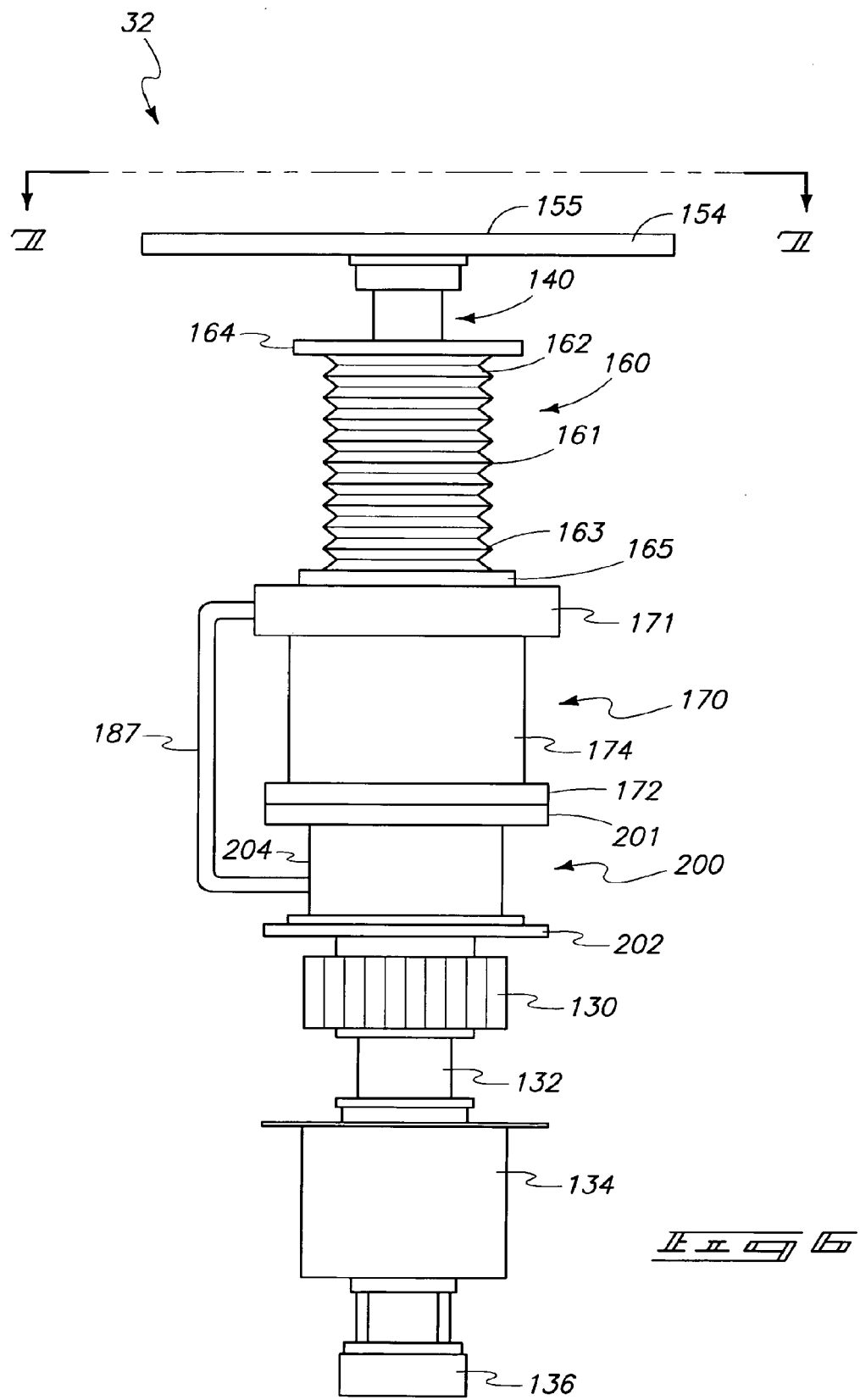
FIG. 6 is fragmentary, side elevation view of a single processing station which is useful in the present invention.

Referring more specifically to FIGS. 4 and 5, the processing apparatus for semiconductor work pieces 40 has a vertically oriented rail 41 which is positioned adjacent to, and below, the processing chamber 31 as seen in FIG. 14.

The vertically oriented rail has a first or upper end 42 which is positioned adjacent to the processing chamber 31, and an opposite, second or distal end 43 which is remote thereto. The vertically oriented rail 41 defines at least one rail slot 44, and which defines a path of travel for various elements of the processing apparatus 40 which will be described in greater detail hereinafter. As seen by reference to FIG. 5, a plurality of substantially vertically oriented apertures are disposed in predetermined spaced relation along the vertically oriented rail 41. These holes or apertures are operable to cooperate with other elements of the assembly as the assembly moves along the rail. The arrangement of the vertically oriented rail 41 is designed such that pressure on the whole mechanical arrangement as seen in FIG. 4 is substantially alleviated.

Referring still to FIGS. 4 and 5, it will be seen that the present processing apparatus 10 includes a support housing 50 defining an internal chamber 51, and which is mounted on the second end 43 of the rail 40. As illustrated in the drawings, a first motor 52 is mounted on the support housing 50, and has a drive shaft 53 which extends outwardly therefrom. Positioned within the chamber 51 of the support housing 50 is a worm gear mechanism which is generally indicated by the numeral 54. The worm gear mechanism 54 is coupled to a drive shaft 55. As illustrated in the present drawings, the processing apparatus 40 includes a drive shaft receiving bracket 60. The drive shaft receiving bracket has a first end 61, and an opposite second end 62 through which the drive shaft 55 extends. As should be understood, by energizing the first motor 52, force is imparted to the drive shaft 55 to cause the drive shaft receiving bracket 60 to move therealong the rail 44 for the purposes which will be described in greater detail, below. In addition to the foregoing, it will be seen that a position sensor 63 is mounted on the rail 41, and which is operable to sense the position of other elements in the processing apparatus as they move along the rail. Still referring to FIGS. 4 and 5, it will be seen that a second motor 64 is mounted near the first end 42 of the vertically oriented rail 41. The second motor 64 is moveably mounted to the rail by means of a motor mount 65. Still further, a position sensor 66 is mounted on the motor mount 65 and is operable to provide relevant positional information for various assemblies of the processing apparatus 40 as will be described in greater detail in the paragraphs which follow.

The processing apparatus of the present invention includes a first support member which is generally indicated by the numeral 70, and which is mounted to the drive shaft receiving bracket 60, and which supports at least two processing stations 32. As seen by reference to FIGS. 4 and 5, the first motor 52 which is provided, is drivingly coupled to the first support member 70, and is operable to selectively and simultaneously move the at least two processing stations 32 along a substantially vertically disposed path of travel as will be described hereinafter. In this regard, the first support member 70 has a top surface 71, and an opposite bottom surface 72. Still further, apertures or receiving stations 73 (FIG. 3) are formed in the first support member, and which are individually operable to cooperate with other assemblies which will be described, below. Still further, the first support member selectively moves along a vertically disposed path of travel which is generally indicated by the numeral 74. It should be further understood that the first support member 70, as well as the second support member, which will be discussed below, includes rail slot engagement members (not shown), and which are individually mounted on each of the first and second support members, and which are matingly received in each of the vertically oriented rail slots 44. These assemblies guide the respective first and second support members along the substantially vertically oriented path of travel 74.

Referring still to FIGS. 4 and 5, the processing apparatus 40 of the present invention includes a second support member which is generally indicated by the numeral 80, and which is mounted adjacent to, and below the processing chamber 31. The second support member 80 is drivingly coupled to the second motor 64 which was earlier described. As seen in the drawings, the second support member has a first or top surface 81, and an opposite, second, or bottom surface 82. A pair of apertures 83 are formed therein (FIG. 3), and which are operable to cooperate with other assemblies which will be described below. As seen in FIGS. 4 and 5, sealing members 84, here illustrated in the form of bellows, are mounted on the top surface 81. The sealing members 84 are each individually operable to receive or otherwise sealingly cooperate with an ejection rod 85 which is sealably contained therein. The ejection rods 85 are each operable to cooperate with individual lifting pins 86. The lifting pins movably cooperate with a pedestal which will be described in greater detail below. As should be understood, the individual sealing members or bellows 84 are connected to the bottom of the processing chamber 31. Still further, the engagement of the ejection rods 85 with the lifting pins 86 are effective for lifting a semiconductor work piece 87, as seen in FIG. 4, off of the accompanying pedestal so that they may be moved into, and out of, the processing chamber 31. It should be understood, therefore, that the second support member 80 cooperates with a plurality of lift pins 86 to move the respective lift pins upwardly and downwardly relative to the respective processing stations 32. Still further, the second motor 64 is drivingly coupled to the second support member 80 and operable to selectively move the second support member 80 along a path of travel 88 so as to cause the reciprocal upward and downward movement of the respective lift pins 86 in each of the respective processing stations 32. In addition to the foregoing, it should be understood that the position sensor 66 is electrically coupled to the second motor 64, and is operable to control the same motor so as to move the second support member 80 upwardly and downwardly along the vertically oriented rail 41 so as to engage the lift pins in an appropriate fashion. The position sensor 66 is rendered operable so as to stop the second motor when the second support member 80 passes the sensor 64 thus insuring that the individual lift pins can only rise and descend within a certain range.

Figure 7:
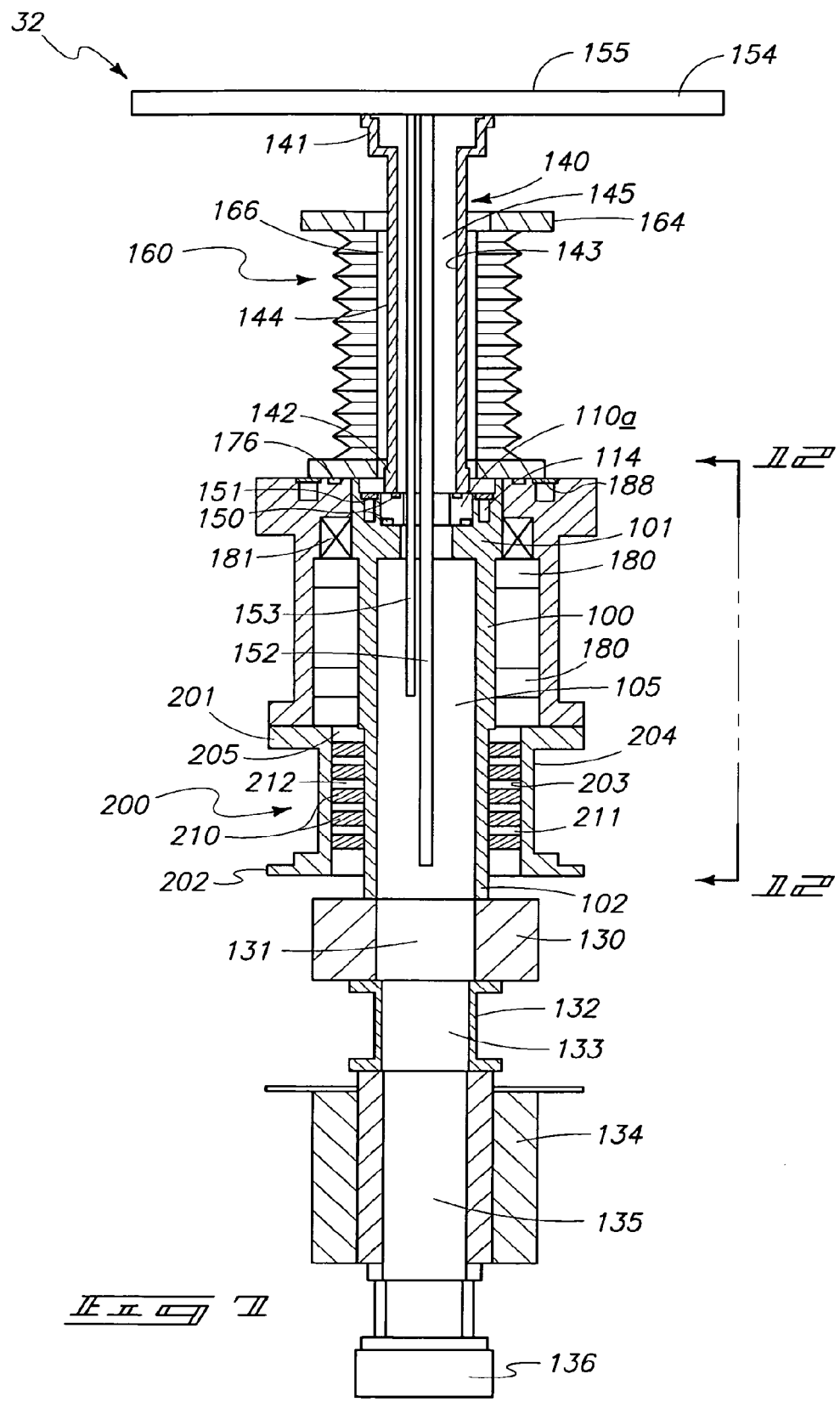
FIG. 7 is a transverse, vertical sectional view of a processing station useful in the present invention, and which is taken from a position along line 7-7 of FIG. 6.
Figure 8:
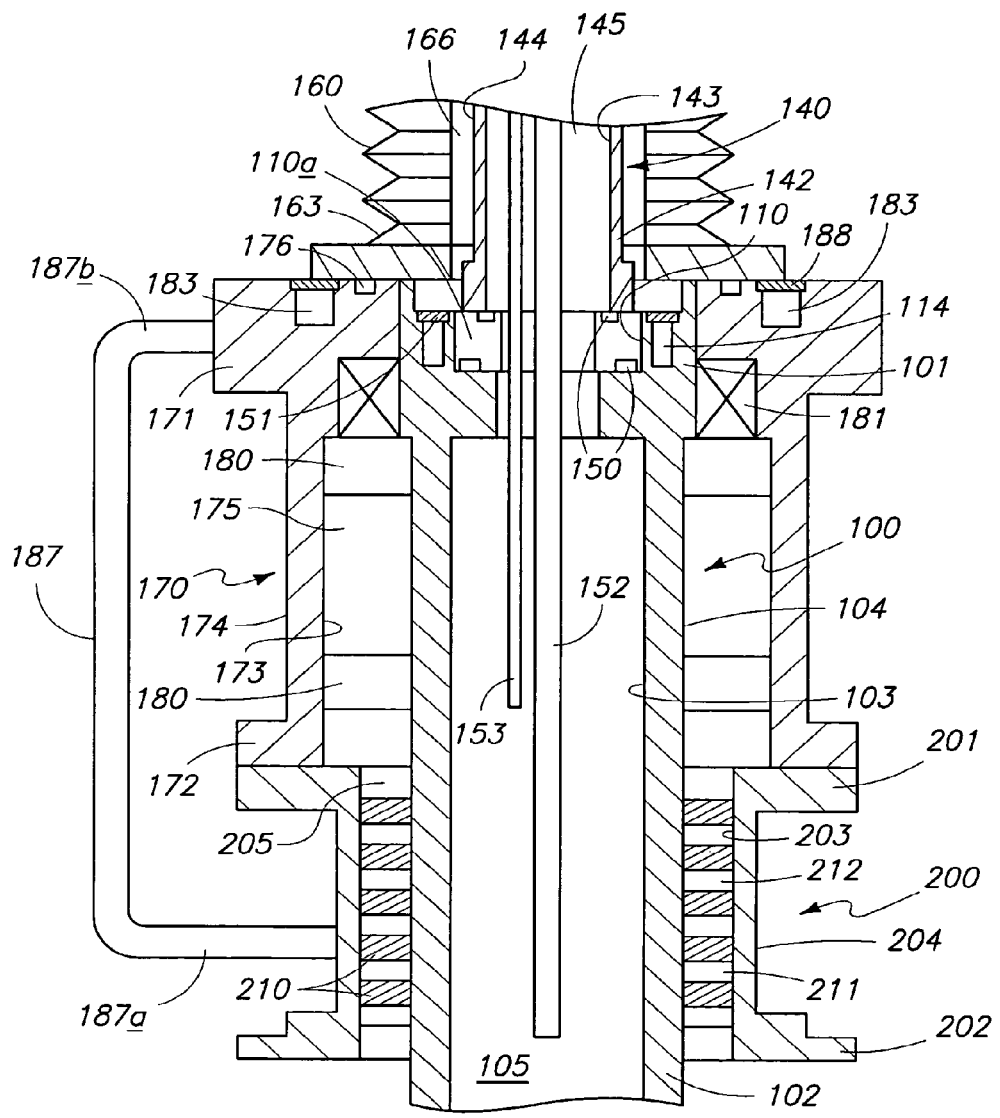
FIG. 8 is a fragmentary, greatly enlarged, transverse, sectional view taken from a position along line 7-7 of FIG. 6.
Figure 9:
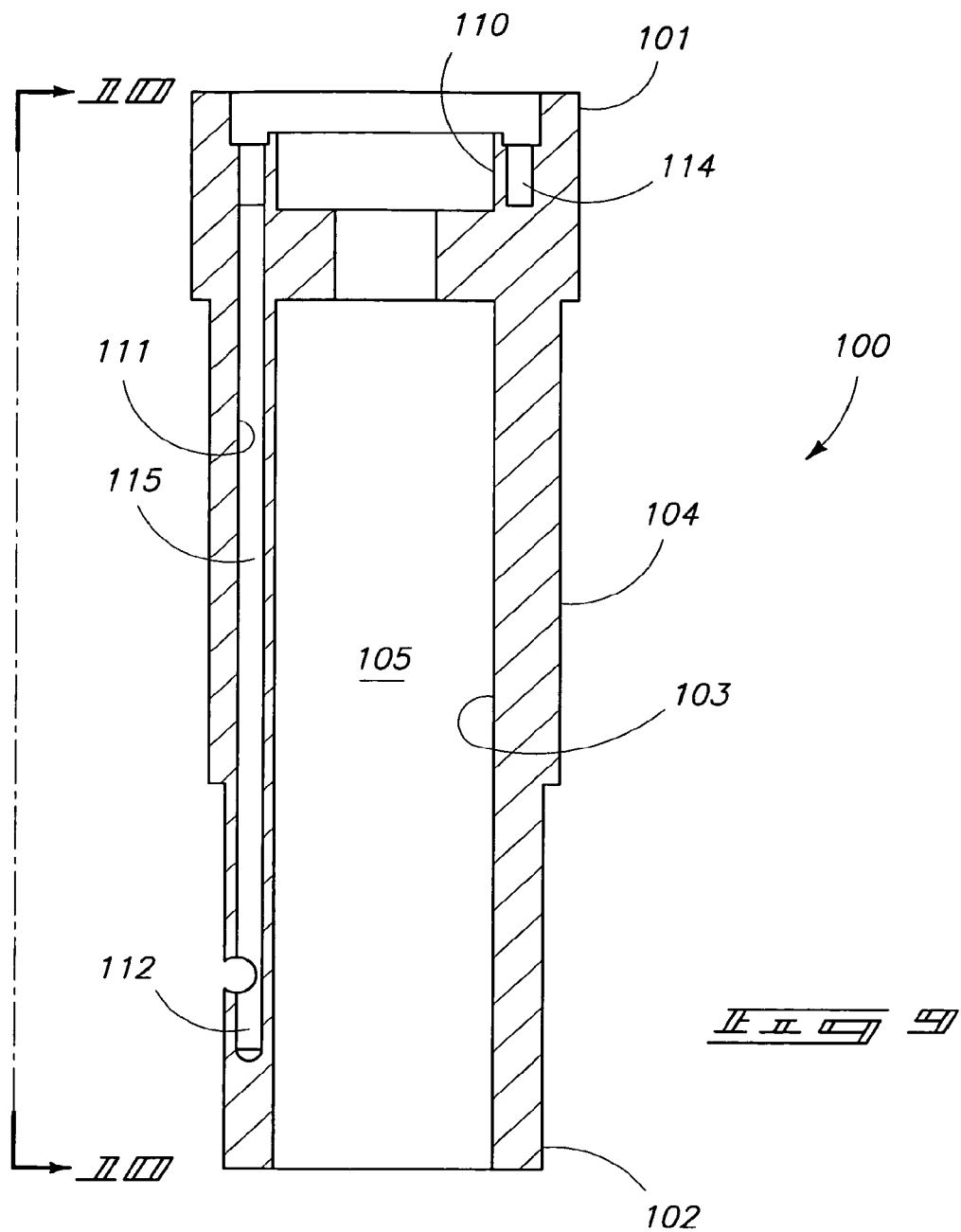
FIG. 9 is a longitudinal, vertical, sectional view taken through a portion of a shaft which is useful in the processing stations employed in the present invention.
Figure 10:
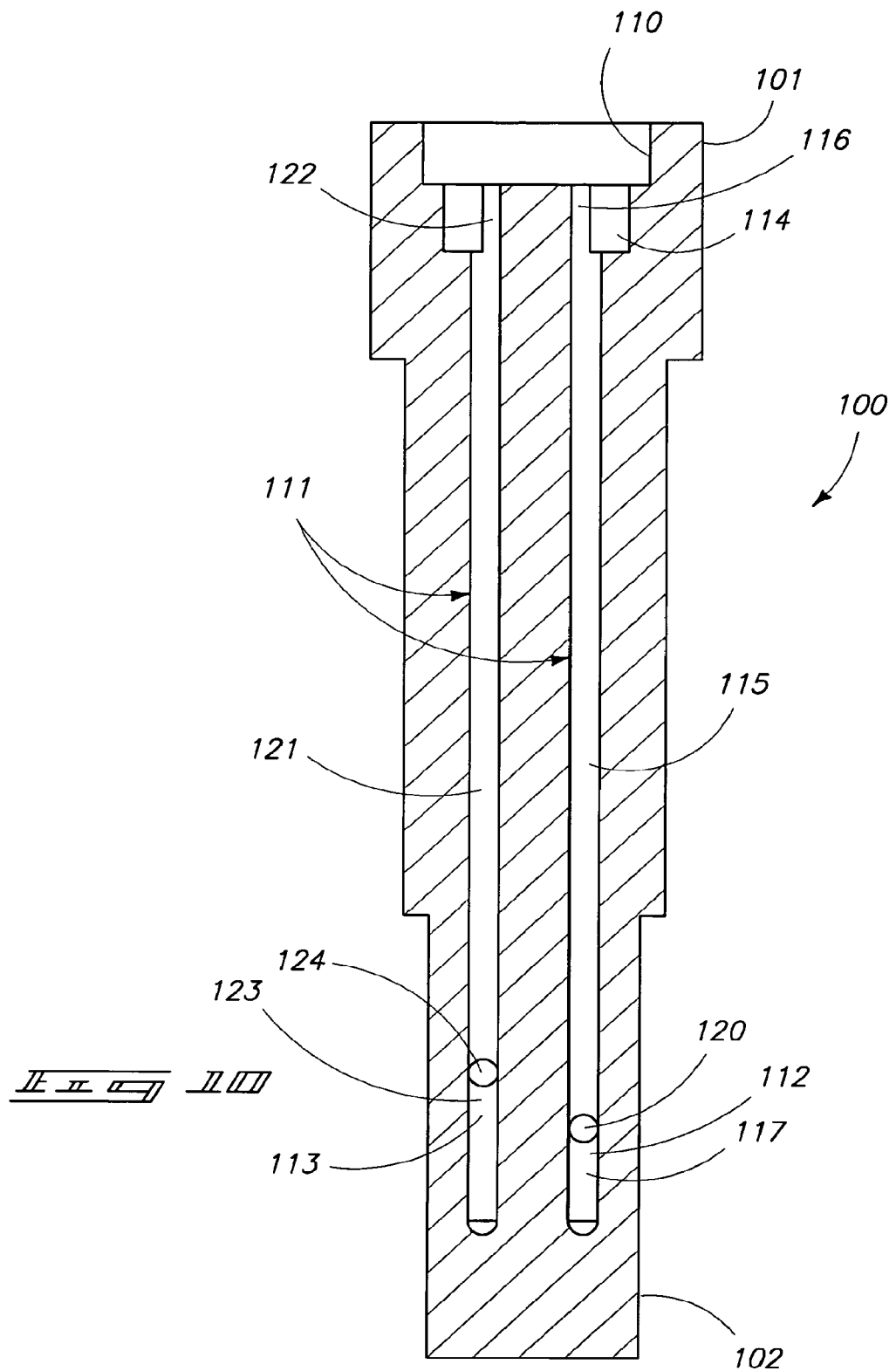
FIG. 10 is a longitudinal, vertical, sectional view which is taken from a position along line 10-10 of FIG. 9.

Referring now to FIGS. 7 and 9, the processing apparatus for semiconductor work pieces 40 of the present invention includes a rotating shaft which is generally indicated by the numeral 100. The rotating shaft has a first, upper or proximal end 101, and a second, lower, or distal end 102. Still further, the shaft defines an inside facing surface 103, and an outside facing surface 104. A longitudinally disposed passageway 105 is defined by the inside facing surface, and extends between the first and second ends thereof. Referring more specifically now to FIGS. 9 and 10, the rotatable shaft 100 defines a connecting block seat 110 which is positioned at the first end 101 thereof, and which is operable to receive a connecting block 110A. The connecting block has a passageway which extends therethrough (FIG. 8). Further, formed in the rotating shaft 100 is a first coolant passageway which is generally indicated by the numeral 111. The first coolant passageway has a first intake end 112, and a second exhaust end which is generally indicated by the numeral 113. Disposed intermediate the first and second ends 112 and 113 is a first coolant slot 114 which is formed thereabout, and in substantially circumscribing relation relative to the first end 101. Still further, the first coolant passageway 111 has a first portion 115 which extends longitudinally therealong the rotating shaft 100. The first portion 115 has a first end 116, which is coupled in fluid flowing relation relative to the coolant slot 114, and an opposite, second end 117 which is remote thereto. In addition to the foregoing, a first aperture 120 is formed in the rotating shaft 100 and is operable to couple the first portion 115 to a source of coolant which will be described in greater detail, hereinafter. Still further, the first coolant passageway 111 includes a second portion 121 which extends longitudinally therealong the rotating shaft 100. The second portion has a first end 122, and an opposite second end 123. Still further, a second aperture 124 is formed through the rotating shaft 100 and allows the second portion of the passageway to be coupled in fluid flowing relation relative to another assembly which will be discussed in greater detail below.

Referring now to FIG. 7, and mounted in force transmitting relation relative to the second end 102 of the rotating shaft 100, is a sprocket belt roller which is generally indicated by the numeral 130. The sprocket belt roller is operable to matingly engage a drive belt which will be discussed in greater detail hereinafter. The sprocket belt roller is operable to impart rotational force from a motor which will be described below, to cause the rotational movement of the shaft 100. The sprocket belt roller 130 defines a centrally disposed passageway 131, and which will accommodate the passage of a plurality of electrical conduits. A spacer assembly 132 is positioned on the opposite side of the sprocket belt roller 130, and further defines a passageway 133 which extends therethrough and which is substantially coaxially aligned relative to the passageway 131 defined by the belt roller 130. Still further, a hub assembly 134 is provided and which is mounted on the spacer assembly 132. The hub assembly 134 similarly defines a passageway 135 which extends therethrough. The hub assembly allows electrical conduits to pass therethrough, but prevents the electrical conduits from being entangled while the respective processing stations 32 rotate. Mounted endwardly of the hub assembly 134 is a signal amplifier 136. The signal amplifier is coupled to other components of the processing apparatus which will be described also in the paragraphs which follow.

Referring more specifically to FIGS. 7 and 8, the processing apparatus for semiconductor work pieces 40 of the present invention includes a supporting rod, conduit, or member 140, and which extends substantially longitudinally outwardly relative to the first end 101 of the rotating shaft 100. The supporting rod 140 has a first or proximal end 141, and an opposite second or distal end 142, which is affixed in an appropriate fashion to the first end 101 of the rotating shaft by means of the connecting block 110A. This attachment may be facilitated by means of various conventional fasteners, not shown. The supporting rod has an inside facing surface 143, and an outside facing surface 144. The inside facing surface defines a longitudinally disposed passageway 145 which extends between the first and second ends; and which accommodates the passage of other conduits which will be described, below. As further seen by references to FIGS. 7 and 8, a pair of sealing members which are generally indicated by the numeral 150, are mounted on, or cooperate with, the connecting block 110A, and which are operable to sealably couple the supporting rod 140 to the rotating shaft 100. Still further, a seal 151 is positioned in substantially covering relation relative to the first coolant passageway 111. As seen in FIGS. 7 and 8, a pair of wire pipes, or conduits 152 and 153 extend through the coaxially aligned and longitudinally disposed passageways 105 and 145, respectively. The wire pipes, or conduits include a first wire pipe 152 which directs electrical conduits (not shown) to a heating unit or assembly such as a resistor wire which is located within the pedestal 154 (not shown); and a second wire pipe 153 which directs electrical conduits (not shown) to a temperature detection apparatus which is operable to detect the surface temperature of the accompanying pedestal 154. The pedestal 154 which is mounted on the first end 141 of the supporting rod has a top supporting surface 155 which supports the semiconductor work piece 87 (FIG. 4) within the processing chamber 31 for processing.

Figure 13:
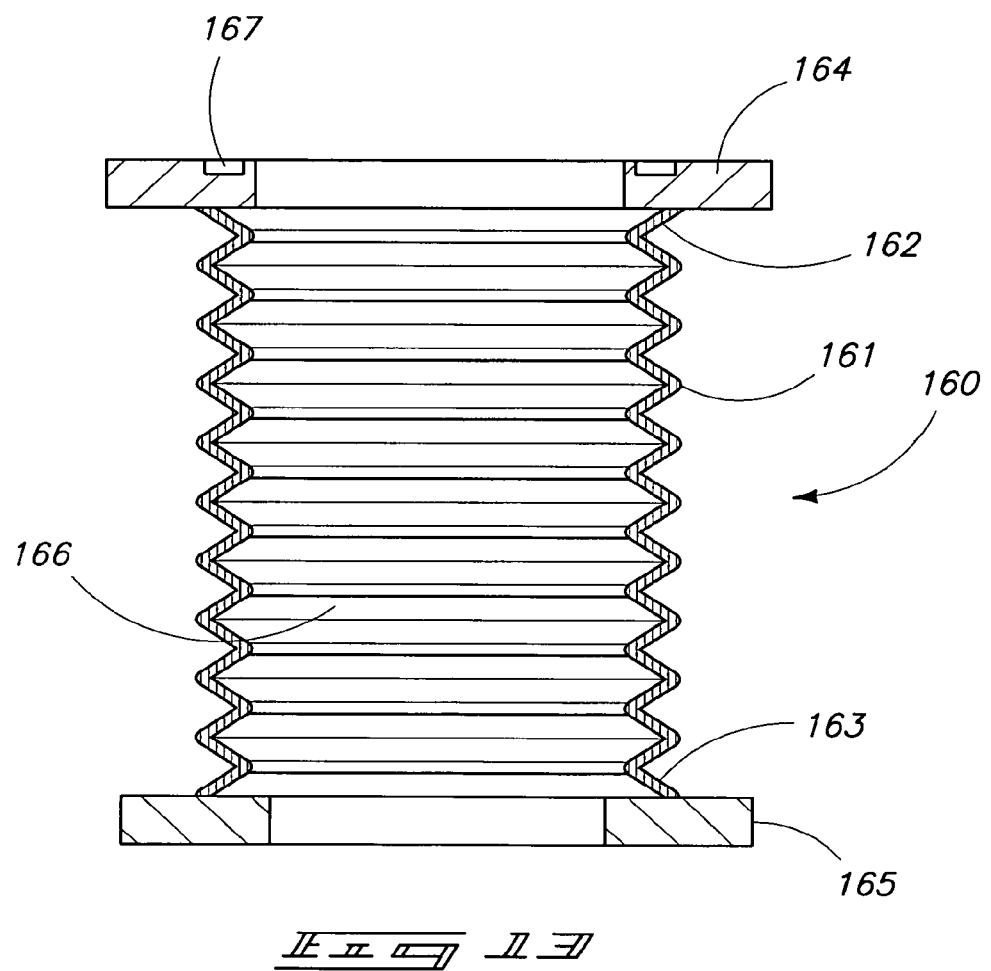
FIG. 13 is a fragmentary, longitudinal, vertical sectional view taken through a bellow which is useful in the present invention.

Referring more specifically to FIGS. 7, 8 and 13, the processing apparatus for semiconductor work pieces 40 of the present invention includes individual bellow seals 160 which are positioned within each of the processing stations 32. The respective bellow seals 160 operate to insure that the connection between the supporting rod 140, and the processing chamber 31 is substantially sealed. In this regard, the bellow seal 160 sealably couples to the bottom of the processing chamber 31 in the manner as follows. Referring now to FIG. 13, it will be seen that the bellow seal 160 has a main body 161 through which the supporting rod 140 extends. The respective bellow seals 160 are generally longitudinally symmetrically deformable, and further has a corrugated main body 161 which can be distorted with pressure and then restored to its original length once the pressure is removed. The respective bellow seals 160 are typically fabricated from a metal material such as stainless steel or the like. The main body 161 has a first end 162, and an opposite second end 163. Still further, a first circumscribing flange 164 is positioned at the first end 162, and further, a second circumscribing flange 165 is positioned at the second end 163. As seen, the main body 161 defines a longitudinally disposed passageway 166 through which the supporting rod 140 extends. Additionally, a sealing member 167 is positioned about, or otherwise cooperates with the first flange 164, and is operable to substantially seal the first flange to the bottom of the processing chamber 31. The first and second flanges 164 and 165 are fabricated from metal. Therefore, the first and second flanges 164 and 165 can be affixed to adjacent surfaces by welding and the like.

Figure 12:
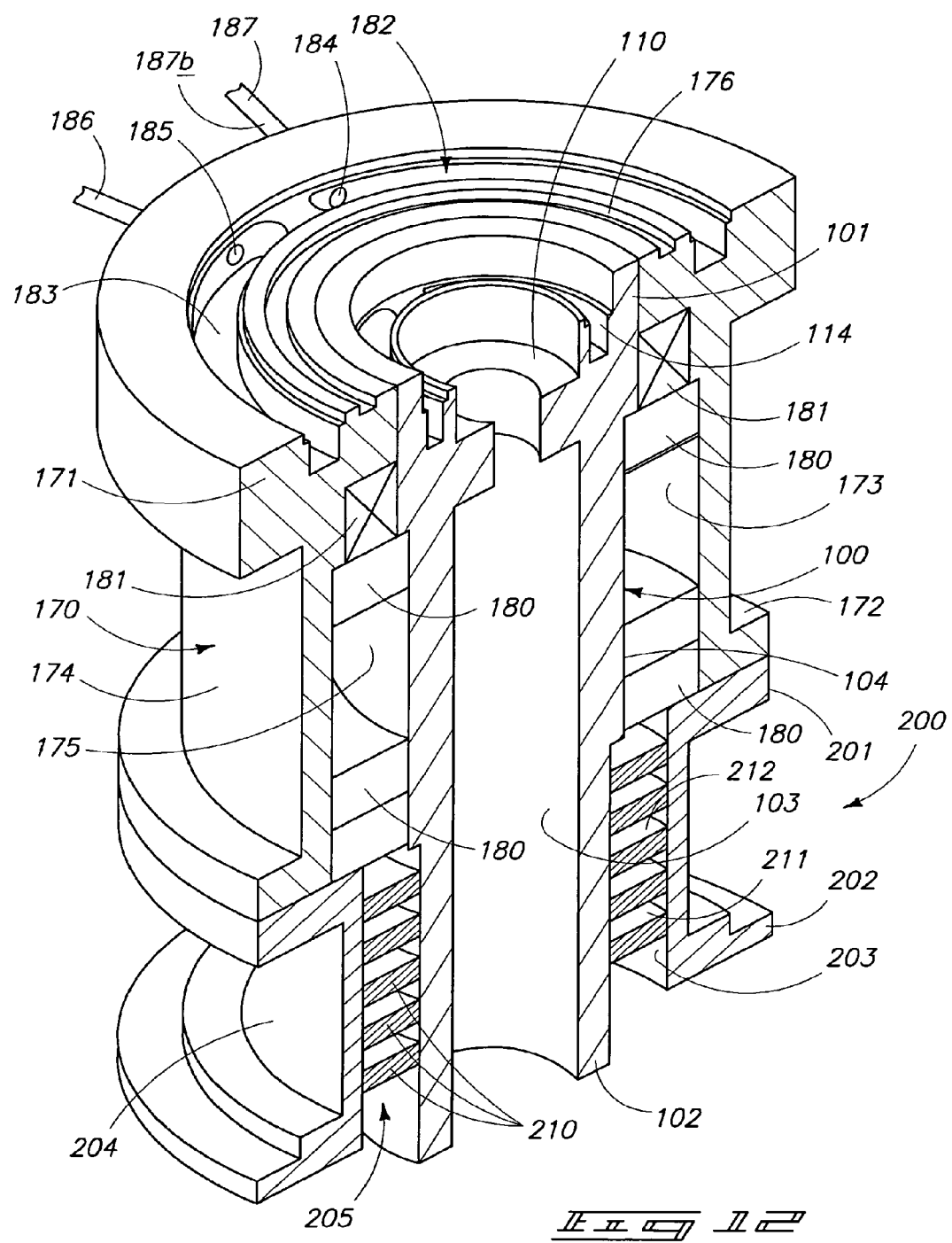
FIG. 12 is a fragmentary, perspective, longitudinal, vertical, sectional view taken from a position along line 12-12 of FIG. 7. Some supporting structures have been removed to illustrate the structure thereof.

Referring now to FIG. 8, the processing apparatus for semiconductor work pieces 40 of the present invention further includes a first outer shell which is generally indicated by the numeral 170. The first outer shell has a first or upper end 171 to which the second end 163 of the bellow seal 160 is secured by welding or the like. Further, the first outer shell 170 has a second, or lower end 172 which is remote thereto. The first outer sell 170 has an inside facing surface 173, and an outside facing surface 174. As seen in the drawings, the first outer shell 170 is received in the apertures or receiving stations 73 which are defined by the first support member 70. The inside facing surface 173 defines a longitudinally disposed passageway 175 which extends between the first and second ends 171 and 172, and which telescopingly receives the rotatable shaft 100. As best seen by reference to FIG. 8, a sealing member 176 is positioned or otherwise received on the first end 171, and is operable to seal thereagainst the second end 163 of the bellow 160. As will be recognized, for example, by a study of FIG. 8, the rotating shaft 100, which comprises a part of the platform rotation mechanism for rotating the semiconductor work piece 87 extends into the longitudinally disposed passageway 175 of the first outer shell and is rotatable relative thereto. As will be seen by reference to FIG. 8, a pair of bearings 180, of conventional design, are mounted or otherwise received within the longitudinally disposed passageway 175 and are positioned such that respective bearings are positioned on or near the opposite ends thereof. The pair of bearings 180 facilitate rotation of the rotatable shaft member 100 as described earlier. In addition to the foregoing, a magnetic sealing component which is generally indicated by the numeral 181, is positioned near the first or upper end 171, and thereby sealingly couples the rotating shaft 100 relative to the first outer shell 170. Referring now to FIGS. 8 and 12, it will be seen that the first outer shell 170, and more specifically the first end 171 thereof, defines, at least in part, a second coolant passageway 182 (FIG. 12). The second coolant passageway includes a second coolant slot 183 which is positioned near the first end 171, and which circumscribes same. The second coolant slot 183 has a first intake end 184, and a second exhaust end 185. Still further, an external exhaust conduit 186 is coupled in fluid flowing relation relative to the second exhaust end 185 (FIG. 12). As should be understood, the second coolant passageway 182, which is formed in the first outer shell 170 is positioned, at least in part, near the magnetic sealing component 181. Still further, the first and second coolant passageways 111 and 182, respectively, are coupled in fluid flowing relation one relative to the other by way of an externally mounted conduit 187. As further seen by reference to FIGS. 7 and 8, a sealing component 188 is positioned in covering relation relative to the second coolant slot 183 and thereby sealably engages the bellow seal which is generally indicated by the numeral 160.

The present invention 40 further includes a second outer shell which is generally indicated by the numeral 200, and which cooperates with, and is generally coaxially aligned relative to the first outer shell 170. The second outer shell has a first end 201 which is juxtaposed relative to the second or lower end 172 of the first outer shell, and is affixed thereto by conventional fasteners. Further, the second outer shell has an opposite, second end 202. Still further, the second outer shell has an inside facing surface 203, and an outside facing surface 204. Still further, a longitudinally disposed passageway 205 is defined by the inside facing surface 203, and extends between the first and second ends 201 and 202. This passageway is substantially coaxially aligned relative to the longitudinally disposed passageway 175 which is defined by the first outer shell 170. As best illustrated in the drawings, it will be appreciated that the sprocket belt roller 130 is disposed in predetermined spaced relation relative to the second end 202. As earlier described, rotational force imparted to the sprocket belt roller 130 is operable to impart rotational movement to the rotatable shaft 100 so that it may freely rotate within the passageway 175. As best seen by reference to FIG. 11, it will be appreciated that first and second apertures 206 and 207, respectively, are formed in the second outer shell 200 and which facilitate fluid flowing communication with the longitudinally disposed passageway 205 for the purposes which will be described in further detail, below.

Figure 11:
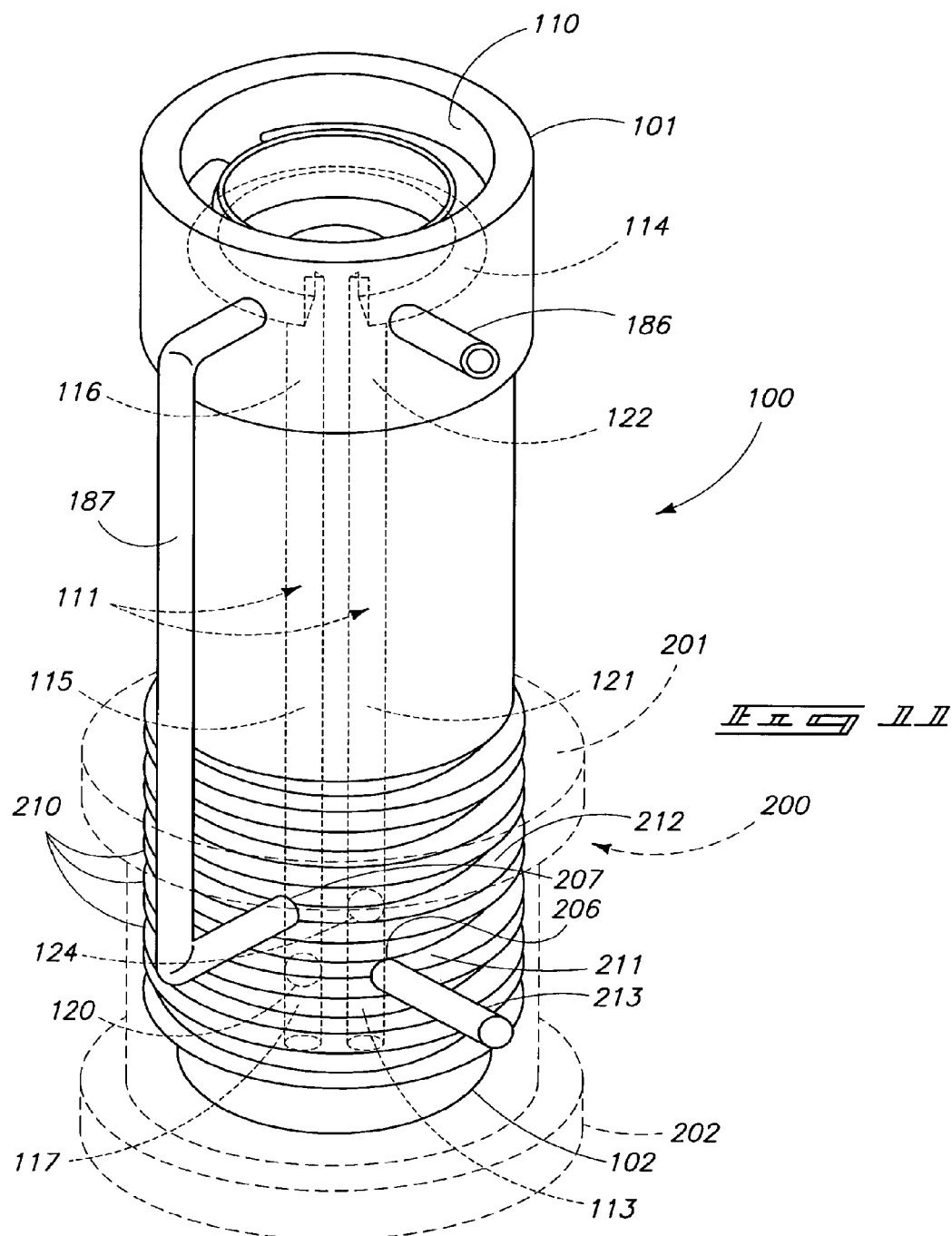
FIG. 11 is a fragmentary, greatly simplified view of the cooling passageways which are provided in the present invention. Some underlying surfaces are shown in phantom lines.

Referring more specifically to FIGS. 11 and 12, it will be seen that the processing apparatus 40 of the present invention includes a plurality of sealing components which are generally indicated by the numeral 210, and which are received within the longitudinally disposed passageway 205, and which sealingly couples the rotatable shaft 100 to the second outer shell 200. The plurality of sealing components 210 are disposed in predetermined spaced relation along the rotatable shaft 100. The plurality of sealing components further define a first ring gap 211, and a second ring gap 212 which are best seen by reference to FIG. 11. As should be understood, the first ring gap 211, and the second ring gap 212 are operable to pass coolant therealong as will be described below. With regard to FIGS. 9, 10 and 11, it will be appreciated that the first aperture 120 formed in the rotatable shaft 100 is located within the first ring gap 211; and further a coolant inlet or conduit 213 is coupled in fluid flowing relation relative thereto. A source of coolant (not shown) enters in through the coolant inlet/conduit 213 and travels along the first ring gap 211. The coolant thereafter enters the first portion 115 of the first coolant passageway 111. Still further, the second aperture 124 formed in the rotating shaft 100, and which is located at the second end 113 of the second portion 121 of the first coolant passageway 111, is located within the second ring gap 212. As earlier described, an external conduit 187 has a first end which is coupled in fluid flowing relation one relative to the second ring gap 212, and an opposite second end which is coupled in fluid flowing relation one relative to the second coolant passageway 182, which is defined, in part, by the second coolant slot 183. In this arrangement, coolant leaving the first portion 115 of the first cooling passageway 111 travels along the first coolant slot 114, and then passes into the second portion 121 of the first coolant passageway. The coolant then exits the second portion of the first coolant passageway by way of the second aperture 124. The coolant then travels along the second ring gap 212. The coolant then exits the second ring gap 212 and enters into the first end 187A of the external conduit 187. The coolant exits the second end 187B of the external conduit 187 and enters into the second coolant passageway 182 which is defined, in part, by the second coolant slot 183. As earlier described, the second coolant slot 183 circumscribes, at least in part, the first end 171 of the first outer shell 170 and is further disposed in spaced relation relative to the first coolant slot 114. The second coolant slot has a first intake end 184 and a second exhaust end 185. The second end 187B of the external conduit 187 is coupled in fluid flowing relation relative to the first intake end 184 of the second coolant slot. Still further, the present invention includes, as earlier described, an external exhaust conduit 186 coupled to the second exhaust end 185 of the second coolant slot and which exhausts the coolant to ambient.

Referring now to FIG. 15, it should be understood that a processing apparatus for semiconductor work pieces 40 of the present invention includes a platform rotation mechanism which is generally indicated by the numeral 220, and which individually cooperates with each of the heated and rotatable processing stations 32 in order to simultaneously heat and rotate the respective processing stations 32 in a synchronous fashion. In this regard, the platform rotation mechanism which is mounted below the processing chamber 31 includes an electrical motor 221 which has a drive shaft (not shown), and wherein a drive sprocket/pulley 222 is mounted on the drive shaft and is rotatable therewith. Still further, and mounted adjacent to the electric motor 221 is a first pair of spaced idler pulleys 223. Still further, and located in spaced relation relative to the respective sprocket belt roller assemblies 130 which are mounted on the respective processing stations 32, are a second pair of idler pulleys 224. As seen from the drawing, a continuous belt 225 is received thereabout the drive sprocket/pulley 222 and is directed by way of the first and second pairs of idler pulleys 223 and 224 to matingly and forcibly engage the respective sprocket belt roller assemblies 130 as provided for on each of the processing stations 32. As should be understood, the continuous belt 225 has an undulating or ribbed drive surface 226. As earlier described, the sprocket belt rollers are operable to matingly and drivingly engage the undulating drive surface 226 of the continuous belt 225. As seen in FIG. 15, the single electric motor 221 is operable to simultaneously drive or rotate adjacent processing stations 32 in an advantageous manner.

OPERATION

The operation of the described embodiment of the present invention is believed to be readily apparent and is briefly summarized at this point.

In its broadest aspect, the present processing apparatus for semiconductor work pieces of the present invention 40 comprises a processing chamber 31 having an internal cavity 33, and which further has a plurality of rotatable processing stations 32 positioned in the internal cavity 33. Each of the respective rotatable processing stations 32 process individual semiconductor work pieces 87. As earlier described, a platform rotation mechanism 220 individually cooperates with each of the rotatable processing stations 32; and an electrical motor 221 is coupled to at least two rotatable processing stations 32 so as to drive the respective processing station in a synchronous fashion. As seen in FIG. 15, the electric motor 221 is drivingly coupled to the respective rotatable processing stations by a continuous belt 225. In the arrangement as seen in that drawing, a sprocket belt roller 130 is mounted on each of the respective rotatable processing stations 32. The continuous belt 225 transmits force from the electric motor 221 to the respective sprocket belt rollers 130 so as to cause rotation of the respective rotatable processing stations 32.

Another aspect of the present invention relates to a processing apparatus for semiconductor work pieces 40 which comprises a processing chamber 31 having an internal cavity 33 and which has a plurality of rotatable processing stations 32 located within the internal cavity 33. The respective processing stations 32 are each operable to process a semiconductor work piece 87. The plurality of rotatable processing stations 32 can move upwardly, downwardly and/or rotate relative to the processing chamber 31. The present invention 40 further comprises a sealing assembly such as the bellow seal 160, and the magnetic sealing components 181, and which maintain the internal cavity 33 of the processing chamber 31 substantially sealed while the rotatable processing stations 32 move upwardly, downwardly and rotate. Still further, the processing apparatus 40 further comprises a cooling apparatus for cooling the sealing assemblies to facilitate the proper operation of the sealing assemblies. In this regard, the cooling apparatus includes a first coolant passageway 111; a second coolant passageway 182; the first and second ring gaps 211 and 212, respectively; as well as the externally mounted conduit 187 which is operable to direct a source of coolant which facilitates the cooling of various assemblies within the apparatus 40, and further inhibits heat related damage to the seals of the processing chamber 30.

The present invention also relates to a method for processing semiconductor work pieces 87 which comprises a first step of providing a processing chamber 31 having an internal cavity 33; and providing a plurality of processing stations 32 within the internal cavity 33 of the processing chamber. The methodology further includes another step of positioning individual semiconductor work pieces 87 on each of the individual processing stations 32; and rotating and heating the individual processing stations 32 so as to facilitate the effective processing of the semiconductor work pieces 87 within the internal cavity 33 of the processing chamber 32. As earlier disclosed, the method includes another step whereby the plurality of processing stations 32 are synchronously rotated.

As will be recognized from the foregoing, a first outer shell 170, and second outer shell 200, can be made into a unitary structure. Further, the first coolant passageway 111, and second coolant passageway 182, which are joined together in fluid flowing relation by the external conduit 187, provides a convenient means whereby the coolant circulation path may be lengthened. This facilitates the efficient utilization of the coolant. Further, the present invention provides only one coolant inlet 213 which provides the source of coolant to the present structure. This is an extremely efficient design, and further reduces the cost of manufacturing same.

Therefore it will be seen that the present invention provides a convenient means for processing semiconductor work pieces in a manner not possible heretofore. The present invention further avoids many of the shortcomings attendant with the prior art practices and processes utilized heretofore, and effectively processes a multiplicity of semiconductor work pieces in an efficient and highly advantageous manner.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A processing apparatus for semiconductor work pieces, comprising:
    a processing chamber having an internal cavity and which has two or more rotatable processing stations within the internal cavity, wherein (i) each of the two or more rotatable processing stations is operable to process a semiconductor work piece, (ii) each of the two or more rotatable processing stations can move upwardly, downwardly, and rotate relative to the processing chamber, (iii) each of the two or more rotatable processing stations defines a passageway for accommodating electrical signal inputs, (iv) each of the two or more processing stations comprises a rotatable shaft, and (v) each of the two or more processing stations is mounted on a common support member, the common support member being coupled to a drive shaft and a motor, the motor being drivingly coupled by the drive shaft to the common support member and operable to move the two or more rotatable processing stations along a vertical travel path;
    two or more sealing assemblies which maintain the internal cavity of the processing chamber substantially sealed while the two or more rotatable processing stations move upwardly, downwardly, and rotate;
    a cooling apparatus for cooling the two or more sealing assemblies to facilitate the proper operation of the sealing assemblies wherein the cooling apparatus comprises, at least in part, water cooling conduits, and wherein one of the water cooling conduits comprises an externally mounted conduit; and
    a heating unit comprising a resistor wire associated with each of the two or more rotatable processing stations.

2. A processing apparatus as claimed in claim 1, wherein each sealing assembly comprises a bellows seal having opposite first and second ends, and which further has a passageway which extends between the first and second ends, and wherein the processing chamber has a bottom surface, and the first end of the bellows is sealably secured to the bottom surface of the processing chamber.

3. A processing apparatus as claimed in claim 2, wherein each rotatable processing station further comprises:
a first outer shell having first and second ends, and defining a passageway extending between the first and second ends, and wherein the second end of the bellows is sealably mounted to the first end of the first outer shell, wherein the shaft extends into the passageway of the first outer shell and the shaft is further rotatable relative thereto; and
a magnetic sealing component mounted on the first outer shell and sealably cooperating with the shaft so as to sealably secure the shaft for rotatable motion relative to the first outer shell and the bellows seal.

4. A processing apparatus as claimed in claim 3, wherein each rotatable processing station further comprises:
a sealing component positioned between the first end of the first outer shell, and the second end of the bellows, so as to facilitate the sealing of the bellows to the first outer shell.

5. A processing apparatus as claimed in claim 4, wherein the cooling apparatus comprises:
a first coolant passageway which is formed in the shaft, and which is positioned, at least in part near the sealing component; and
a second coolant passageway which is formed, in the first outer shell, and which is positioned, at least in part, near the sealing component, and wherein the first and second coolant passageways are coupled in fluid flowing relation one relative to the other by way of the externally mounted conduit.

6. A processing apparatus as claimed in claim 5, comprising:
a second outer shell having opposite first and second ends, and which further has a passageway which extends longitudinally thereof, and between the first and second ends, and wherein first end of the second outer shell is mounted on, and is substantially coaxially aligned relative to, the second end of the first outer shell, and wherein the shaft extends through the second outer shell and is rotatable relative thereto; and
a plurality of sealing components which are received in the passageway of the second outer shell and which sealingly couple the shaft to the second outer shell, and wherein first and second ring gaps are defined between adjacent sealing components, the shaft, and the second, outer shell.

7. A processing apparatus as claimed in claim 6, comprising:
an external coolant source coupled in fluid flowing relation relative to the first ring gap, and wherein the first ring gap and the first coolant passageway are coupled in fluid flowing relation, and wherein the source of the external coolant enters the first coolant passageway after first passing along the first ring gap.

8. A processing apparatus as claimed in claim 7, wherein the externally mounted conduit has opposite first and second ends, and wherein the first coolant passageway is coupled in fluid flowing relation relative to the second ring gap, and wherein the externally mounted conduit has a first end coupled in fluid flowing relation relative to the second ring gap, and the second end of the externally mounted conduit is coupled in fluid flowing relation to the second coolant passageway, and wherein coolant in the first coolant passageway passes by means of the externally mounted conduit to the second coolant passageway.

9. A processing apparatus as claimed in claim 1, comprising:
a support conduit cooperating with and extending longitudinally outwardly relative to the shaft of the respective processing station, wherein the shaft defines a longitudinally disposed passageway extending therethrough; and
an electrical conduit extending through the support conduit and the shaft, and which is electrically coupled to the resistor wire, wherein the electrical conduit delivers electricity to the resistor wire to energize same.

\* \* \* \* \*